United States Patent [19]

Haddock et al.

[11] Patent Number: 4,999,277

[45] Date of Patent: Mar. 12, 1991

[54] PRODUCTION OF PRECISION PATTERNS ON CURVED SURFACES

[75] Inventors: Loren B. Haddock; Bruce D. Ballinger, both of Hermosa Beach; George H. Gelb, Rancho Palos Verdes, all of Calif.

[73] Assignee: TRW Inc., Redondo Beach, Calif.

[21] Appl. No.: 158,803

[22] Filed: Feb. 22, 1988

[51] Int. Cl.⁵ .............................................. G03C 5/00
[52] U.S. Cl. .................................... 430/269; 430/311; 430/318; 430/323; 219/121.69
[58] Field of Search ............... 430/318, 319, 394, 323, 430/269, 311; 219/121.69

[56] References Cited

U.S. PATENT DOCUMENTS

| | | | |
|---|---|---|---|
| 3,694,080 | 9/1972 | Malsky | 355/86 |
| 4,081,654 | 3/1978 | Mracek | 219/121.69 |
| 4,450,358 | 5/1984 | Reynolds | 250/492.1 |
| 4,538,914 | 9/1985 | Yomoda et al. | 356/400 |
| 4,592,648 | 6/1986 | Tabarelli et al. | 355/43 |
| 4,653,903 | 5/1987 | Kawasaki et al. | 355/53 |
| 4,659,225 | 4/1987 | Takahashi | 356/358 |
| 4,662,754 | 5/1987 | Mayer | 356/401 |
| 4,666,818 | 5/1987 | Lake et al. | 430/256 |
| 4,835,087 | 5/1989 | Bielli et al. | 430/318 |

Primary Examiner—Jose Dees
Attorney, Agent, or Firm—Ronald M. Goldman; Ronald L. Taylor

[57] ABSTRACT

The projection of a planar distorted pattern onto a three dimensional surface provides a true or undistorted pattern on that surface. Complex patterns are applied to an irregular or curved surface by a method which includes the formation of a graphics display of the body on a computer graphics display and conversion to a two dimensional CADAM data base containing a planar projection of the pattern intended for application to the curved surface. This pattern information is translated into other forms, such as the form of a numerically controlled milling machine tape or photo mask, which is then used by ancillary method apparatus to form the desired pattern as a part of the method. The process describes the construction of a dichroic parabolic RF reflector.

9 Claims, 2 Drawing Sheets

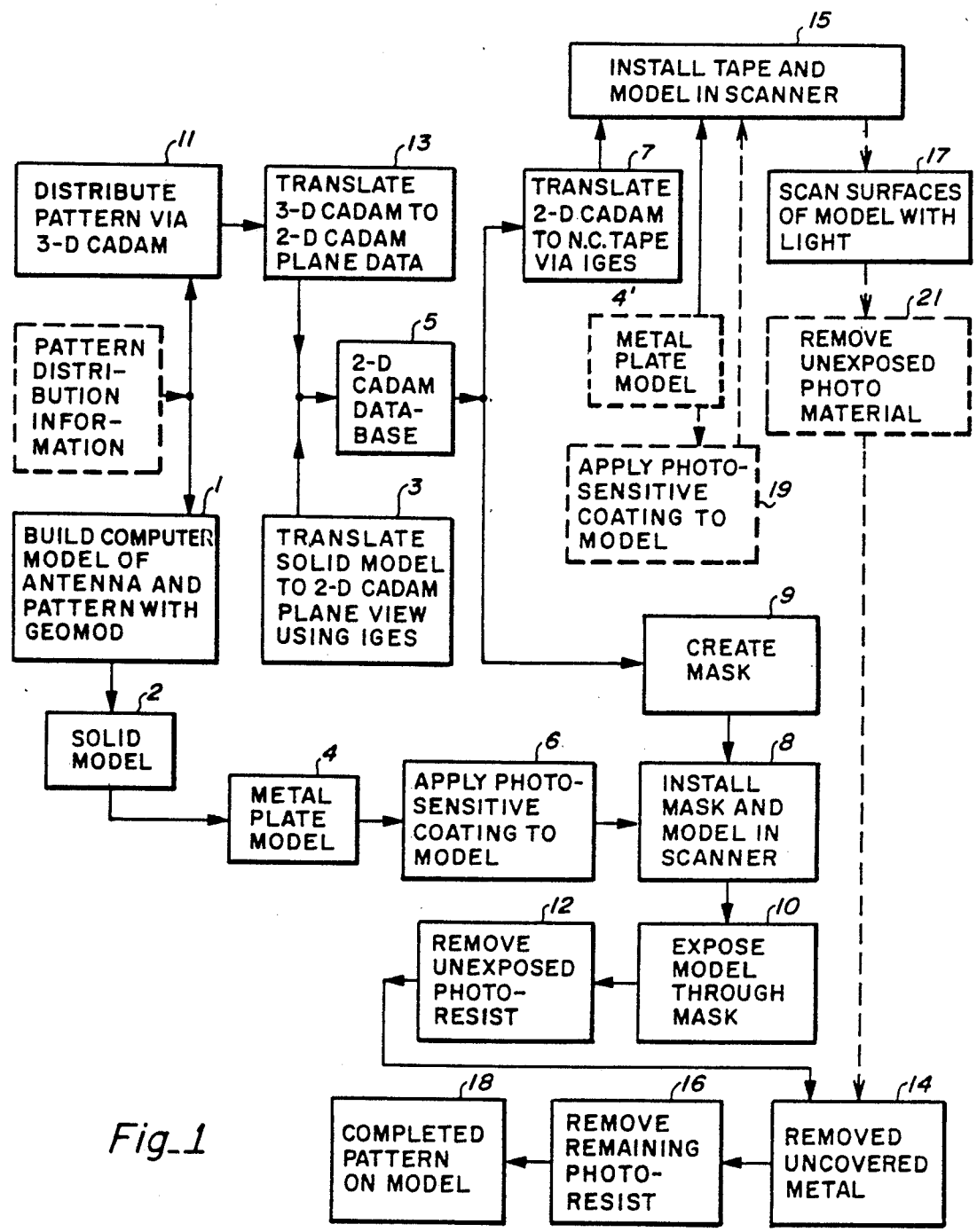
Fig_1

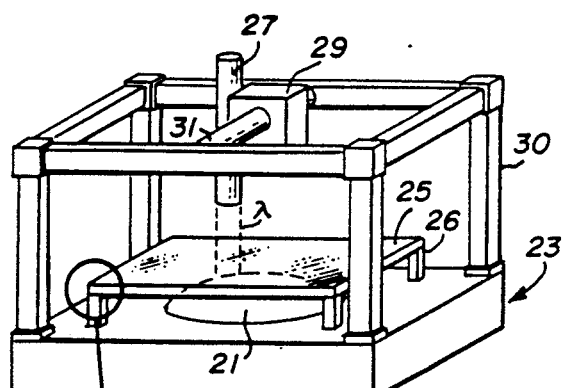
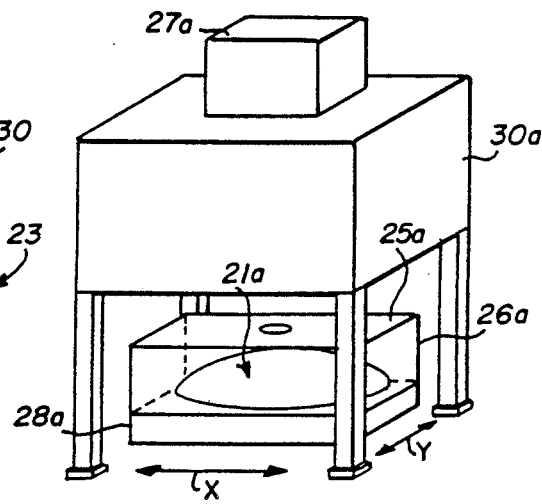
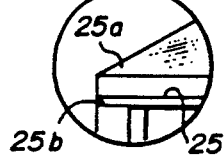
Fig_2
Fig_2a
Fig_2b
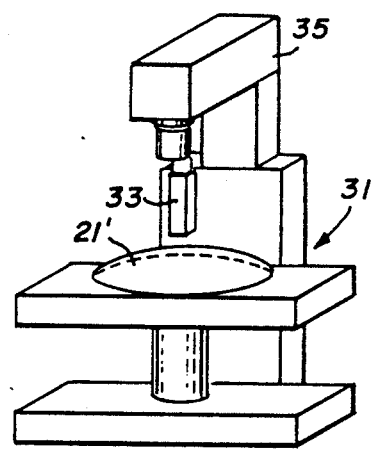
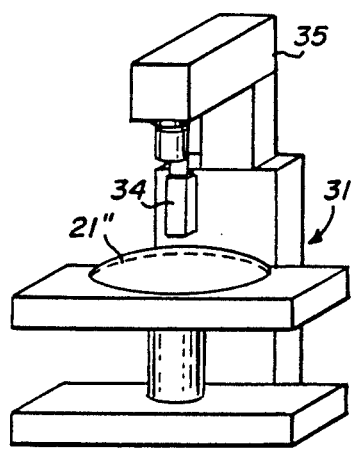
Fig_3
Fig_4
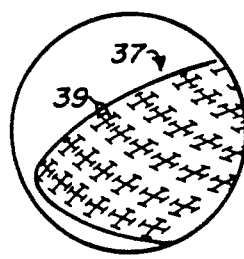
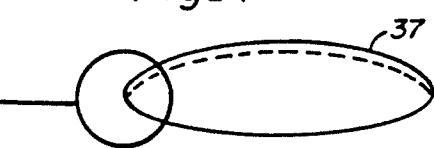
Fig_5a
Fig_5
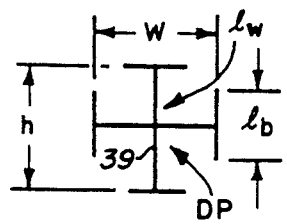
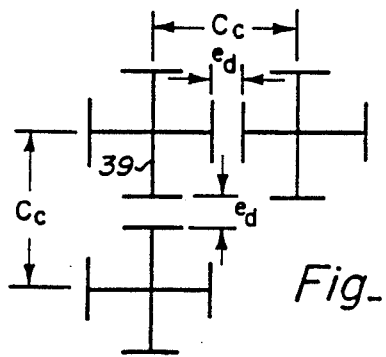
Fig_5b
Fig_5c

PRODUCTION OF PRECISION PATTERNS ON CURVED SURFACES

FIELD OF THE INVENTION

This invention relates to a process for applying a complex pattern on a curved surface and, more particularly, to a process for forming a complex relatively thin conductive metal pattern, such as a dichroic pattern upon a curved or irregular three dimensional surface, such as a curved parabolic surface, useful as a dichroic reflector for high frequency RF propagation applications.

BACKGROUND

Advanced communications satellites are to utilize millimeter wave RF frequencies for communications purposes. The antennas in those satellite communications systems are intended to be directional and thus alternatively provide spot and broad area coverage over selected geographic areas on earth. For this purpose the use of dichroic surfaces as reflectors and subreflectors is a primary means for obtaining in the antennas adequate RF channel separation and physical compactness desired in satellite applications. An existing process for producing dichroic RF reflecting surfaces is to apply a metalized dichroic pattern, a series of spaced dipoles, on a curved surface, such as a parabolic shaped surface, using an "segmented orange skin" approach; one in which the metal pattern is fabricated and then oriented over and stuck onto the parabolic surface in small pieces. This approach is time consuming and costly. Further, although useful at lower frequencies, at the higher millimeter wave frequencies, the process results in butt-joint discontinuities; mechanical protrusions in the surface that occur at the juncture of two separately cut metal pieces that are attached to the surface side by side. These discontinuities are unacceptable at millimeter wave frequencies, at which a quarter wavelength measures approximately 0.075 inches, because they effectively change the antennas radiation distribution pattern. In addition to antenna application, other applications exist in which precise metalization of non-planar or irregular three dimensional surfaces is required, such as with printed circuits that are to conform to irregular shapes and three dimensional RF strip lines, a form of microwave transmission line.

An object of the invention is to provide a fast and effective process for fabricating complex intricate metal patterns on a non-planar curved surface. A secondary object is to provide a process for producing millimeter wave dichroic parabolic antenna reflector.

SUMMARY OF THE INVENTION

In the process, a "CADAM" brand type data base is generated which represents the projection in a single plane of the complex pattern applied over the curved or irregular three dimensional surface. The data base is then converted to a second media, a two dimensional media, such as by way of example, a photo resist mask or a series of photo resist masks or a control tape for a numerically controlled machine, such as a numerically controlled optical machine. A source of collimated light is then used to create the pattern on the curved surface by scanning the light over the surface under control of the tape driven machine. In one specific aspect of this process the mask is oriented overlying and in register with the curved photoresist coated surface and the source of collimated light is directed through and scanned over the mask pattern, whereby portions of the underlying photoresist coated surface, is exposed to the light in the shadow or negative image of the pattern contained on the mask, changing the properties of the exposed portion of the photoresist coating.

In a further aspect of the process, the "Cadam" data base is used to create a tape for a numerically controlled machine and the numerically controlled machine carries as the light source a high power cutting laser. The laser is used to vaporize or cut away portions of the copper cladding on a copper clad surface, leaving in place on that surface the configuration or patterns specified by the numerically controlled machine tape. In a still further example, a photo chemically coated curved metal plated insulator surface is machined using an activating collimated light source, suitably ultraviolet light, that is scanned over the surface, exposing those particular areas of the photosensitive coating in a pattern defined by the data base information contained on the controlled machines tape, the tape having been created in the earlier described manner; whereby the exposed areas of coating are transformed from a normal to a semi-hardened characteristic. The surface is then treated in any known manner to remove the unexposed portions of the photosensitive coating, exposing underlying portions of the metal plating. The surface is then placed in a metal etchant to remove the exposed metal, while the semi-hardened layer protects the remaining underlying metal. The semi-hardened coating is then removed to provide the surface containing the desired metal pattern.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings

BRIEF DESCRIPTION OF THE DRAWINGS

In the drawings:

FIG. 1 illustrates the process in flow chart form;

FIG. 2 illustrates a step in the process and the accompanying apparatus for defining patterns on the curved surface;

FIG. 2a is a partial view of a portion of FIG. 2;

FIG. 2b illustrates an alternative fixture to that of FIG. 1;

FIGS. 3 and 4 illustrate alternative apparatus used in the process for applying the patterns to a curved surface;

FIG. 5 illustrates the shape of a dichroic reflector;

FIG. 5a is an enlarged view of an end portion of the reflector of FIG. 5;

FIG. 5b illustrates a dichroic element in enlarged view; and

FIG. 5c illustrates the spacing between elements as are formed according to the process.

DETAILED DESCRIPTION

As represented in block 1 in FIG. 1, a computer model of the curved surface and the pattern intended to be formed on that surface is generated on a convention computer graphics display using any of the well known computer graphic programs, such as the "GEOMOD"

brand program. The surface is constructed in three dimensional solid form, using the results of the computer model, as represented in block 2, or, alternatively, the data is translated into another database as represented in block 3. The "Geomod" program is one that is distributed by Structural Dynamics Research Corp. of San Diego, Calif. It is a software program which allows an engineer to design hardware on a computer with the design appearing as a solid geometry in free space. These graphic design programs are well known in the art of computer graphics. Likewise the associated computers, such as Apollo, Digital Equipment Corp., IBM, Sun, and H-P computers, and displays which use the "GEOMOD" program are also well known in the computer graphics art to which the reader may make reference if desired.

Using the foregoing apparatus, the curved surface and the pattern are effectively "built" on the computer with all appropriate dimensions and proportions being given. Fabricators blueprints for the surface are printed out on a conventional plotter and given to a model maker, who may build the surface. The surface is then treated as herein described.

As represented in block 3, the three dimensional computer generated model or simulation of the pattern is then translated to a two dimensional plan view, which represents the pattern as viewed from the top side in a single plane by way of example. This is accomplished using another well known standard translator "IGES". IGES stands for Initial Graphics Exchange System. It is a standard developed jointly by industry to transfer the data bases created using one program, such as "CADAM" to a form usable by another program, such as "GEOMOD". The "IGES" program takes the data and generates a two dimensional "CADAM" data base.

The "CADAM" graphics program is a well known computer graphics program. It is distributed by CADAM, Inc. of Burbank, Calif. "CADAM" may be regarded as an acronym for computer aided design and manufacturing. The software program lets the engineer or draftsman perform design or drafting on a computer. Usually it is run on an IBM computer. Its data base may be used for many purposes. In the application of this process, the "CADAM" data base contains the representation in digital form of the complex patterns as viewed in a two dimensional plane, specifically from the top side in the example given. As represented at block 5 in FIG. 1, the data base is then translated into the form of a numerically controlled tape as represented in block 7, such as by use of the IGES standard referred to previously or, alternately the database is supplied to a plotter as represented in block 9.

As those skilled in the art recognize, the form of the information contained in the data base must be translated into a form that is specified by the manufacturer of numerically controlled tape inputted milling machines which are available in the industry. This translation or conversion program is well known to those who use that equipment. The tape is then used to control the milling machine which carries out further steps in the process as is hereinafter described.

Alternatively the "Cadam" data base is translated into a two dimensional plotter pattern on a photographic mask. This is accomplished by using a conventional precision graphic plotter represented in block 9, such as the Gerber Plotter, known in the industry. The Gerber Plotter is a z-axis (x,y) processor controlled photo plotter made by the Gerber Corporation. It is used to make precision photo masks for printed circuit board manufacture using data supplied by a computer database, such as the "Cadam" program. It incorporates software, a computer program made available from Gerber for that purpose. The Gerber Plotter takes "Cadam" information directly and fabricates a photographic mask. The resulting mask used by the additional apparatus to carry out further steps in the process as is hereinafter described in more detail.

An alternative technique for creating the two dimensional pattern data base is also represented in FIG. 1. The pattern to be applied is contained as three dimensional "Cadam" data as represented by block 11. This data is stored in the form used by that known program. As previously described a principal use of the "Cadam" program is to allow a three dimensional object to be viewed from many angles, hence the object may be made to appear to rotate in position on the computer display terminal allowing the equipment designer to view the part from many angles. Each view is in essence the projection of the three dimensional part upon a two dimensional plane. As represented in block 13, the three dimensional pattern data is translated or converted from three dimensional form to a two dimensional "Cadam" data base. As in the prior example, this 2-D "Cadam" data base represented at block 5 may be further converted to the numerically controlled tape form, such as represented in block 7, and alternatively into the form used by the Gerber Plotter through use of the IGES standard conversion, described earlier, to generate a photo mask pattern as represented in the block 9. As those familiar with the high resolution capabilities of computer aided graphics generation recognize, the generation of the complex patterns and its translation or conversion to other forms of data base provides an effective and rapid means for generating and handling highly complex patterns containing minute elements in those patterns, such as the dichroic dipoles referred to for use in millimeter wave reflectors.

The solid non-metallic model or surface on which a conductive pattern is to be formed is "metalized" or plated with a thin layer of the desired metal, such as copper or gold. One preferred known technique for so plating the surface is a metal deposition process. In this process the surface is placed in a vacuum chamber, which contains a heater and the plating metal. The chamber is evacuated and the heating elements are operated to vaporize the metal. The vaporized metal in the vacuum is diffused and deposits upon the surface forming a strong bonded metal coating Thereafter a photosensitive coating is applied over the metal layer in a conventional manner. The coating may be the light sensitive polymer applied as a film or spray familiar to those in the printed circuit board art and often referred to as a photoresist, a 1.5 mil film of "DuPont Riston" film is an example.

As represented in FIG. 2, surface 21 is placed within an automated measuring device 23 in a position underlying the photo mask assembly 25. This photomask contains the pattern, more appropriately a negative image of the pattern, and was produced by the steps described in FIG. 1. As illustrated in FIG. 2a, the mask assembly consists of optical glass plates 25a and 25b with the mask pattern 25c sandwiched in between. Suitably the mask assembly contains appropriate registration marks so that the mask is accurately oriented over the target surface 21. Automated measuring device 23 contains a collimated ultraviolet light source 27 which is carried by a positioning element 29 of the measuring device. Suitably the light source is a shaped beam of light in the ultraviolet frequencies having an axial spread no greater than one and one half degrees off axis. Other sources of collimated light may be substituted, such as a laser.

Positioning element 29 of the measuring device is controlled to move laterally along the cylindrical guide bar 31. In turn, the bar 31 can move to the left and to the right in the fixture. This movement is controlled by conventional control circuits within the measuring device, not illustrated in the figure and that are not necessary to an understanding of the invention. This device is programmed so that the ultraviolet light source is scanned across the mask starting from one end to the other end and then down, line by line. Those portions of the mask containing the pattern obstruct the light; whereas the open portions of the mask allow the light to shine through and expose the underlying portion of the photo sensitive coating on shaped surface 21.

Alternatively, an apparatus for exposing the photomask may be of a type in which the source of ultraviolet light is held stationary and the mask and surface are supported on a movable (x,y) table such as is pictorially illustrated in FIG. 2b.

As those skilled in the photo etching appreciate, upon completion of the process the exposed portions of the photo sensitive coating are in effect cured or hardened. Surface 21 is then treated to remove away the unexposed portions and underlying metal leaving the metal pattern defined by the exposed portion of the photoresist. This is represented further in FIG. 1 to which reference is again made. As represented in block 4, the model is metal plated, the photoresist coating is applied as presented in block 6, the mask and model are installed and scanned as earlier described as represented in blocks 8 and 10, respectively, and the photoresist is removed as at block 12.

The surface is immersed in a "wash" chemical, suitably 1,1,1 Trichloroethane ("TCE"), and the non-hardened portions of the photoresist are removed, exposing the underlying metal plating. The surface is then immersed in a metal etchant solution, such as a strong acid, chromic acid, if the plating is copper, and the exposed copper is removed as represented by block 14. The semi-hardened photoresist overlying other portions of the plating is essentially immune to the acid etchant and protects the underlying portions of the metal layer. The surface is then placed in a bath of the liquid wash, also suitably 1,1,1 Trichloroethane, and the bath is ultrasonically agitated to remove the hardened portion of the photoresist as represented in block 16, exposing the remaining metal, which is in the desired pattern as represented at block 18.

The exact details of time, temperature, and concentration will vary according to many factors, including the thickness and quality of the coated materials. The factors and details are well known to those skilled in the printed circuit board and plating arts and need not be described further.

An alternative that is essentially "maskless" derives through the steps leading through the plating of the model or surface as at 4' and the creation of the control tape as at block 7; and the installation in the scanner as at block 15. This is followed by scanning as represented by block 17. The scanning may be a cutting laser. As pictorially depicted in FIG. 3 to which reference is made, the surface 21', which in this instance is clad or coated with a metal, such as copper, is placed on the table of a numerically controlled milling machine 31, pictorially partially illustrated in this figure. The milling machine supports a cutting laser 33 which is mounted to a positioning arm 35, the details of which are not important to the understanding of the invention and are well known to those in the numerically controlled milling machine arts. In as much as the milling machine is controlled by the information contained on the tape. As previously described, the tape contains the geometrical planar information of the pattern. Accordingly in operation of the milling machine, the laser is positioned to or scans all areas of the surface in the negative of the image of the desired patterns. The laser generates intense light bursts that cut or etch away the copper cladding, exposing the underlying insulative surface. Upon completion of the milling operation, the remaining copper cladding is in the form of the desired pattern An alternative to the laser cutting or etching of a copper clad surface in the steps presented in FIG. 3 also uses the numerically controlled machine. Reference is again made to the flow chart of FIG. 1 for this additional alternative. The metal coated model represented by block 4' is covered with a photoresist as represented at 19 and the model and numerically controlled tape are installed in the scanner as at block 15.

The milling machine presented in FIG. 4 contains a photo active light source, such as ultraviolet light. Target surface 21" in this figure is a metalized insulator that further contains a photosensitive chemical coating, such as a photoresist described earlier, the same as surface 21 described in FIG. 2. The photo chemical coating is such that the exposure to the laser's light hardens the areas exposed to the light. The laser is driven to and generates light on portion of the surfaces in the negative of the pattern contained in the numerically controlled tape governing the operation of the milling machine. Upon completion of the operation using the equipment of FIG. 4, the curved surface 21" in the same manner described provides the metal pattern on surface as was accomplished and described in connection with the apparatus of FIG. 2. This is represented further in FIG. 1 by the removal of the unexposed photoresist as at block 21, the removal of the uncovered metal at block 14, the removal of the remaining photoresist at block 16 and the resulting pattern on model at block 18.

As those skilled in the art recognize, the surface used in the preceding examples is a gradually sloped parabolic or hemispherical surface. The conductor pattern on the surface when projected into a two dimensional frame contains very little distortion. As the sides of the curved surface have a deeper slope, the distortion becomes greater, hence an addition to the process steps illustrated in FIG. 2 is desirable. In that instance a series of photo masks may be generated and used. In the area of greater slope a photograph or photo mask in the form of a ring or annulus may be generated to fit over a portion of the surface. In that instance the annular mask contains only a portion of the overall pattern. The ultraviolet light is used to expose that portion of the surface underlying the annular shaped mask. Suitably a series of such ring shaped masks are produced which are contiguous with one another with the central mask being circular so that each section defines a small portion of the overall pattern. Because the ring shaped mask may be placed closer to the photo conductively treated areas of the target surface, the distortion is less.

A parabolic dichroic antenna reflector 37 made according to the process is illustrated in FIG. 5 and a portion of that reflector is shown to enlarged scale in FIG. 5a revealing the pattern of small regularly spaced metal antenna elements 39 referred to as cross dipoles or "Jerusalem crosses". As illustrated to a greatly enlarged scale, at frequencies on the order of 40 to 44 GigaHertz each dipole is of a dimension of 0.1265 inches width, w, and height, h, and has the end cap ends approximately 0.060 inches in length, lb. The line width, lw, is 0.005 inches. As presented in FIG. 5c, center to center adjacent dipoles, Cc, are spaced 0.134 inches apart and end to end, ed, are spaced 0.015 inches.

The reflector serves as a filter that reflects RF signals in the 40–44 GHz frequency range. The 0.1265 inch end bar functions as quarter wave length resonator and the 0.015 inch spacing between end bars defines a capacitance that determines RF cross coupling between adjacent dipoles, affecting the bandwidth of filtering.

The foregoing example of an antenna constructed according to the novel technique attests to the utility of the process.

It is believed that the foregoing description of the preferred embodiments of the invention is sufficient in detail to enable one skilled in the art to practice the invention. However, it is expressly understood that the details of the steps and elements, which are presented for the foregoing enabling purpose, are not intended to limit the scope of the invention, in as much as equivalents to those steps and elements and other modifications thereto, all of which come within the scope of the invention, become apparent to those skilled in the art upon reading this specification. Thus the invention is to be broadly construed within the full spirit and scope of the appended claims.

What is claimed is:

1. The method of fabricating a complex pattern on a curved three dimensional surface, said surface being of a first material having a covering layer of a second dissimilar material which includes the steps of: creating a CADAM data base containing a definition of the complex pattern in two dimensional view as representing a two dimensional projected view of said pattern as applied to the three dimensional surface; coating the surface that is to receive the pattern with a thin covering layer of material, such material having the characteristic of changing its physical properties or state responsive to exposure to a source of collimated light, with said material of said covering layer being different from the material of the body; and scanning a collimated light source along a series of spaced parallel lines in and about a plane spaced from coated portions of the surface of said body, whereby some portions of said body are spaced from said light source at distances different from that by which other portions of said body are spaced from said light source, to expose said coated three dimensional surface underlying said plane to light in the negative image of the pattern defined in said data base.

2. The method as defined in claim 1 wherein the step of coating said surface comprises the step of coating said surface with a photo sensitive material to provide a photosensitive coating thereon.

3. The method as defined in claim 2 further comprising the steps prior to scanning of: translating the pattern information contained in said Cadam data base into a two dimensional pattern located on a relatively planar shaped photographic mask; positioning the curved three dimensional surface in registry with the pattern contained on said mask with said mask lying in a plane spaced from said surface; whereby scanning said mask along a series of straight line paths with said source of collimated light exposes the photosensitive coating on said curved three dimensional surface in the negative image of the pattern contained on said mask derived from said data base; and wherein the method further comprises the steps of: removing the unexposed portions of said photosensitive coating to uncover portions of the second material; and etching the portions of the surface with an etchant that attaches and removes said second material to expose said first material without removing said remaining photosensitive coating; and thereafter removing said remaining photosensitive material.

4. The invention as defined in claim 3 wherein said first material comprises an electrical insulator, said second material comprises a metal and said photosensitive material comprises a photoresist.

5. The method as defined in claim 2 further comprising the additional steps prior to scanning of: translating said CADAM data base into a numerically controlled tape control media for a controlled milling machine; and controlling the scanning of said light source through pattern information contained on said milling machine tape control media to expose said target surface in the negative image of the pattern defined by said milling machine tape control media; and further comprising the additional steps of: removing the unexposed portions of said photosensitive coating from said three dimensional curved surface to uncover portions of said underlying second material; and etching the uncovered portions of the surface from which said photosensitive coating was removed with a metal etchant to remove the uncovered portions of second material without removing said exposed portions of said photosensitive coating to expose portions of said first material that underlies said second material; and thereafter, removing the remaining portions of photosensitive coating.

6. The method as defined in claim 1 further comprising the steps prior to scanning of: applying a metal cladding to the surface; translating the pattern information as contained in said two dimensional "Cadam" data base into the form of a numerical controlled milling machine control tape; and placing the surface within the milling machine; and wherein the step of scanning includes applying high intensity light capable of vaporizing metal to vaporize areas of said metal cladding in the negative of the image of the pattern as represented by information contained on the milling machine tape.

7. The method of manufacturing a dichroic RF reflecting surface of the type containing an array of thin relatively flat metal cross dipole radiating elements of substantially identical size and shape evenly spaced about and affixed to the convex parabolic shaped surface of an electrical insulator material from a body of insulator material having a convex parabolic shaped surface which includes the steps of:

creating a CADAM data base containing a definition of said array of dipole radiating elements in two dimensional view as representing a two dimensional projected view of said array as applied to said convex parabolic shaped surface;

securing a metal coating on the convex parabolic surface of said body;

applying information in said CADAM data base to a plotter and plotting said two dimensional view of said array on a sheet of photographic film material using said computer data base information to fabricate a planar shaped photographic mask containing in a two dimensional plan view the image of a dipole array placing said photographic mask in a plane positioned spaced from the corresponding surface of said body with different locations on the planar shaped photographic mask being spaced from said convex parabolic shaped surface as measured along lines drawn orthogonal to the surface of said mask at such different locations being dependent upon the shape of said convex parabolic shaped surface at those positions and with at least some of said locations being so spaced in different amounts, said mask containing in a two dimensional plan view the image of said dipole array as applied to a surface of the geometry of said convex parabolic shaped surface; and scanning said photographic mask along a series of straight parallel co-planar paths with a source of collimated light energy to expose the surface of said convex parabolic shaped surface in the pattern of the image in said mask, said scanning including moving said light source in and about a plane spaced from said planar mask.

8. The invention as described in claim 7 including the step, following the metal coating of said body, of coating said metal coating with a photoresist material; and including the steps, following the scanning step, of:

removing the portions of photoresist material not exposed to said light energy to uncover the underlying metal;

removing said uncovered metal with a metal etchant to uncover the underlying insulator surface; and removing the remaining photoresist material to uncover the remaining metal coating.

9. The invention as defined in claim 7 wherein said light energy comprises: high energy coherent light having an energy level sufficient to vaporize metal.

* * * * *